United States Patent
Sato et al.

(10) Patent No.: US 10,698,860 B2
(45) Date of Patent: Jun. 30, 2020

(54) ARITHMETIC DEVICE

(71) Applicant: Kabushiki Kaisha Toshiba, Tokyo (JP)

(72) Inventors: Rie Sato, Kanagawa (JP); Hayato Goto, Kanagawa (JP); Koichi Mizushima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 45 days.

(21) Appl. No.: 16/120,583

(22) Filed: Sep. 4, 2018

(65) Prior Publication Data
US 2019/0278740 A1    Sep. 12, 2019

(30) Foreign Application Priority Data

Mar. 12, 2018    (JP) .................. 2018-044541

(51) Int. Cl.
*G06F 15/78*    (2006.01)
(52) U.S. Cl.
CPC ................. *G06F 15/7839* (2013.01)
(58) Field of Classification Search
CPC .. G06N 3/02; G06N 3/04; G06N 3/06; G06N 3/063; G06N 3/0635; G06N 7/005; G06N 10/00; G06N 20/20; G06N 99/00; G06N 7/04; G06N 7/043; G06N 7/046; G06F 17/00; G06F 17/10; G06F 17/11; G06F 17/17; G06F 17/18; G06F 7/57; G06F 7/575; H01L 43/00; H01L 43/02; H01L 43/08; H01L 43/12; G11C 11/16; G11C 11/161; G11C 11/1673; G11C 11/54
See application file for complete search history.

(56) References Cited

U.S. PATENT DOCUMENTS

| | | | |
|---|---|---|---|
| 8,127,075 B2 | 2/2012 | Thibadeau et al. | |
| 2017/0249550 A1* | 8/2017 | Sengupta | H04L 43/08 |
| 2018/0039881 A1* | 2/2018 | Frank | G06N 3/084 |
| 2018/0335973 A1 | 11/2018 | Sato et al. | |

FOREIGN PATENT DOCUMENTS

| | | |
|---|---|---|
| JP | H5-501467 A | 3/1993 |
| JP | 2009-32259 A | 2/2009 |
| JP | 2018-195285 A | 12/2018 |

OTHER PUBLICATIONS

X. Fong, et al., Spin-Transfer Torque Devices for Logic and Memory: Prospects and Perspectives, IEEE Transactions on Computer-Aided Design of Integrated Circuits and Systems, vol. 35 No. 1, 2016 (Year: 2016).*

(Continued)

*Primary Examiner* — Andrew Caldwell
*Assistant Examiner* — Emily E Larocque
(74) *Attorney, Agent, or Firm* — Finnegan, Henderson, Farabow, Garrett & Dunner, L.L.P.

(57) ABSTRACT

According to one embodiment, an arithmetic device includes one or a plurality of arithmetic units. One of the one or the arithmetic units includes a memory part including a plurality of memory regions, and an arithmetic part. At least one of the memory regions includes a line-shaped magnetic part.

8 Claims, 9 Drawing Sheets

(56) References Cited

OTHER PUBLICATIONS

R. Venhatesan et al., Domain-Specific Many-core Computing using Spin-based Memory, IEEE Transactions on Nanotechnology, vol. 13, No. 5, 2014 (Year: 2014).*
H. Yu et al., Energy Efficient In-Memory Machine Learning for Data Intensive Image-Processing by Non-volatile Domain-Wall Memory, 19th Asia and South Pacific Design Automation Conference (ASP-DAC), 2104 (Year: 2014).*
Mizushima et al., "Large-scale Ising-machines composed of magnetic neurons," Appl. Phys. Lett., 111:172406-1-172406-4 (2017).
Mcculloch et al., "A Logical Calculus of the Ideas Immanent in Nervous Activity," Bulletin of Mathematical Biophysics, 5:115-116 (1943).
Hopfield, "Neural networks and physical systems with emergent collective computational abilities," Proc. Natl. Acad. Sci. USA, 79:2554-2558 (Apr. 1982).
Merolla et al., "A million spiking-neuron integrated circuit with a callable communication network and interface," Science, 345:668-673 (Aug. 8, 2014).

\* cited by examiner

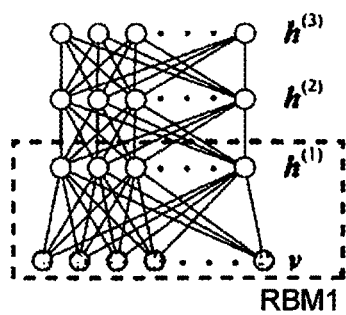 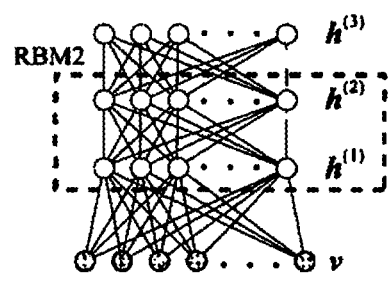 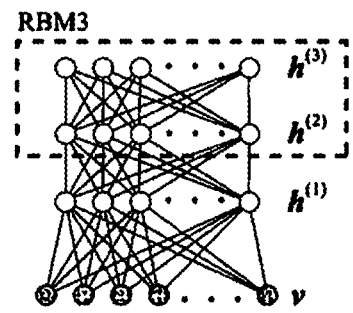
FIG. 7A  FIG. 7B  FIG. 7C
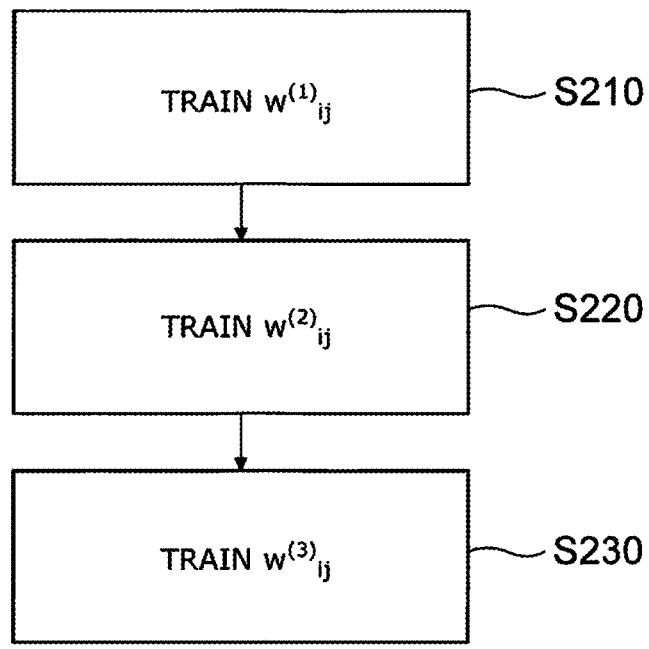
FIG. 8

US 10,698,860 B2

ARITHMETIC DEVICE

CROSS-REFERENCE TO RELATED APPLICATIONS

This application is based upon and claims the benefit of priority from Japanese Patent Application No. 2018-044541, filed on Mar. 12, 2018; the entire contents of which are incorporated herein by reference.

FIELD

Embodiments described herein relate generally to an arithmetic device.

BACKGROUND

A large-scale arithmetic device is desirable.

BRIEF DESCRIPTION OF THE DRAWINGS

FIG. 7A to FIG. 7C are schematic views illustrating a model of an arithmetic device according to a second embodiment;

FIG. 8 is a flowchart illustrating the operations of the arithmetic device according to the second embodiment;

DETAILED DESCRIPTION

Figure 1A:
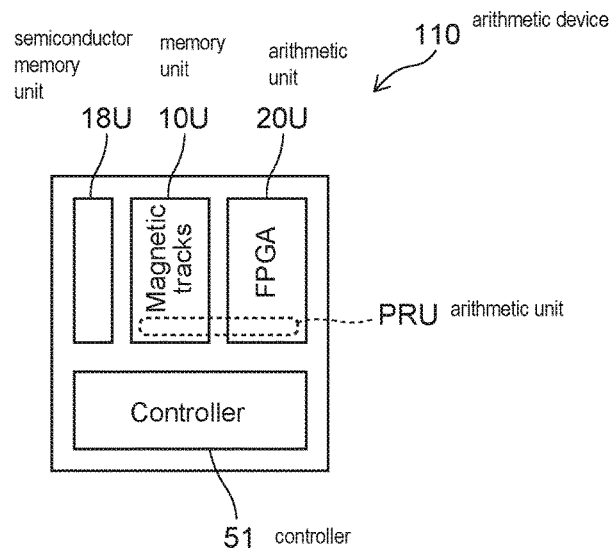
FIG. 1A and FIG. 1B are schematic views illustrating an arithmetic device according to a first embodiment.

According to one embodiment, an arithmetic device includes one or a plurality of arithmetic units. One of the one or the arithmetic units includes a memory part including a plurality of memory regions, and an arithmetic part. At least one of the memory regions includes a line-shaped magnetic part.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
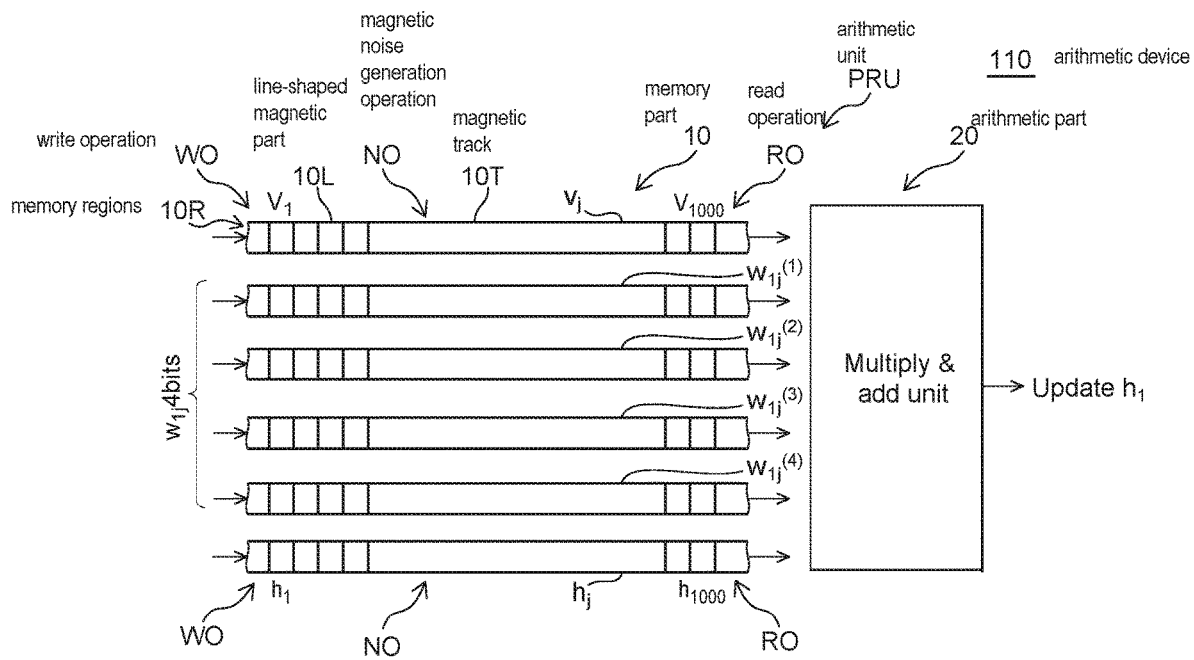

FIG. 1A and FIG. 1B are schematic views illustrating an arithmetic device according to a first embodiment. As shown in FIG. 1A, the arithmetic device 110 according to the embodiment includes a memory unit 10U and an arithmetic unit 20U. The memory unit 10U includes, for example, magnetic tracks. For example, the arithmetic unit 20U performs a product-sum operation. The arithmetic unit 20U may perform a determination. The arithmetic unit 20U is, for example, a FPGA.

A controller 51 is provided in the example. The controller 51 controls the operations of the memory unit 10U and the arithmetic unit 20U.

A semiconductor memory unit 18U may be further provided as in the example shown in FIG. 1A. For example, the semiconductor memory unit 18U may store information relating to a part of the operations performed by the arithmetic device 110. By using the semiconductor memory unit 18U and the magnetic tracks included in the memory unit 10U, storing that is suited to the two can be performed; and, for example, high-speed arithmetic is obtained.

The arithmetic device 110 includes one or multiple arithmetic units PRU. One arithmetic unit PRU includes, for example, a part of the memory unit 10U and a part of the arithmetic unit 20U. The memory mechanism that is included in one arithmetic unit PRU corresponds to a part of the memory unit 10U. The arithmetic mechanism that is included in one arithmetic unit PRU corresponds to a part of the arithmetic unit 20U.

One of the multiple arithmetic units PRU will now be described.

As shown in FIG. 1B, one of the multiple arithmetic units PRU includes a memory part 10 and an arithmetic part 20. The memory part 10 includes multiple memory regions 10R. At least one of the multiple memory regions 10R includes a line-shaped magnetic part 10L. The line-shaped magnetic part 10L is, for example, a magnetic track 10T. The length of the line-shaped magnetic part 10L is greater than the width and the height of the line-shaped magnetic part 10L. The orientations of the magnetizations in the line-shaped magnetic part 10L correspond to stored information.

For example, a write operation WO and a read operation RO are performed for one memory region 10R (line-shaped magnetic part 10L). The write operation WO is performed by a first element described below. For example, the write operation WO is performed based on spin injection. The read operation RO is performed by a second element described below. For example, the read operation RO is performed based on a magnetoresistance effect (e.g., a tunneling magnetoresistance effect).

In the example, a magnetic noise generation operation NO is performed for the one memory region 10R (the line-shaped magnetic part 10L). The magnetic noise generation operation NO is performed by a third element described below. For example, the magnetic noise generation operation NO is performed based on a high frequency magnetic field generated from a spin torque oscillator.

In the arithmetic device 110 as shown in FIG. 1B, product-sum operations are performed in the arithmetic part 20 by using the multiple memory regions 10R (the line-shaped magnetic parts 10L). As described below, for example, it is easy to increase the scale; and higher energy conservation is easy.

An example of an overview of the configuration of the arithmetic device according to the embodiment will now be described.

Figure 2:
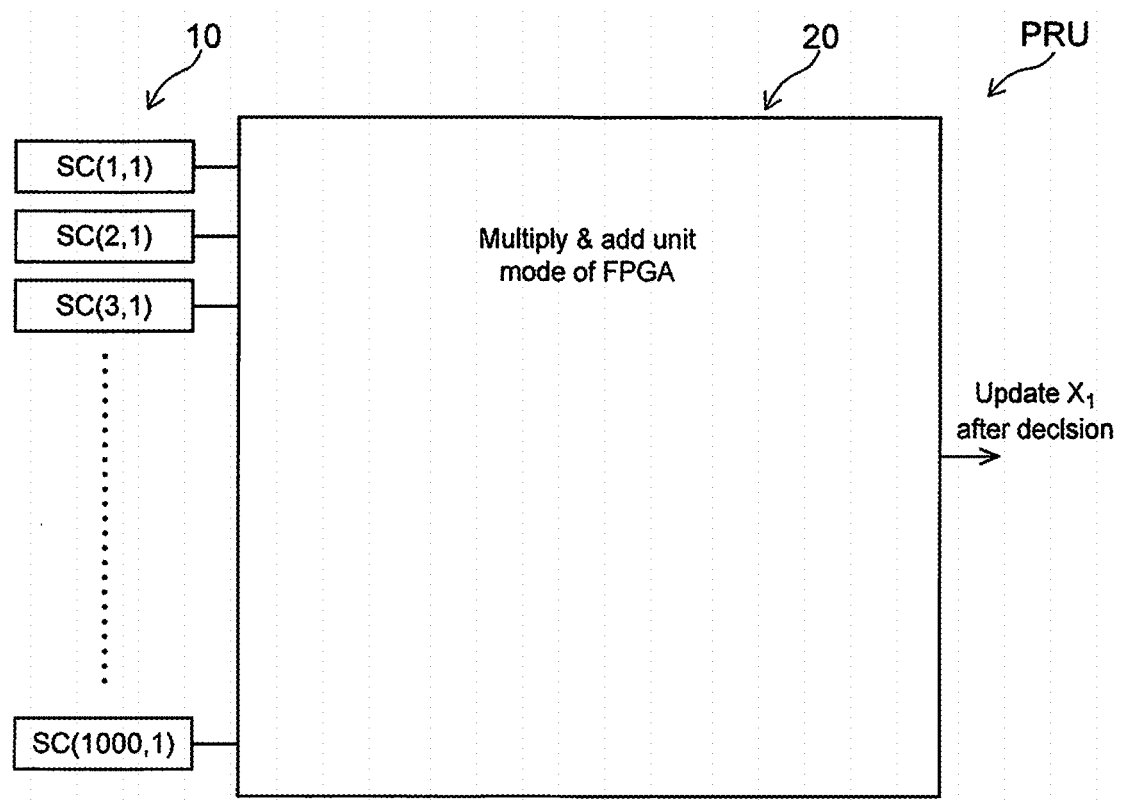
FIG. 2 is a schematic view illustrating the arithmetic device according to the first embodiment.
Figure 3:
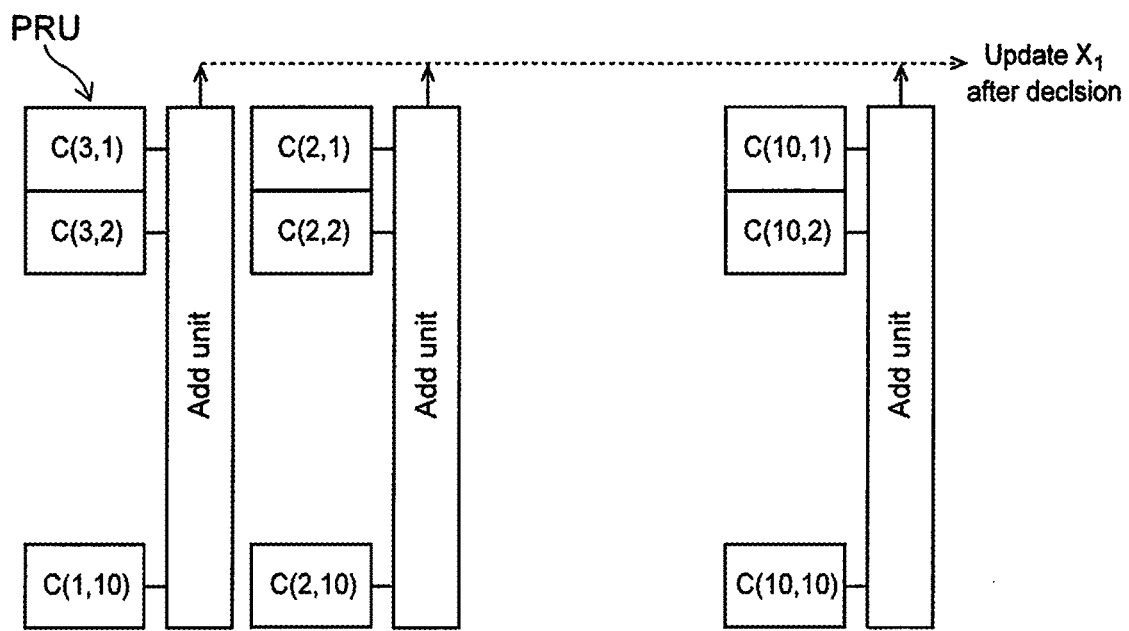
FIG. 3 is a schematic view illustrating the arithmetic device according to the first embodiment.

FIG. 2 and FIG. 3 are schematic views illustrating the arithmetic device according to the first embodiment.

As shown in FIG. 2, the memory part 10 (the arithmetic unit PRU) shown in FIG. 1B is multiply provided. For example, the arithmetic unit PRU corresponds to a sub-core. The arithmetic part 20 performs arithmetic (e.g., a product-sum operation) by using the data stored in the multiple memory parts 10. The multiple memory parts 10 and the arithmetic part 20 are included in one arithmetic unit PRU. The multiple arithmetic units PRU are provided as shown in FIG. 3. Large-scale arithmetic is possible.

The arithmetic device 110 according to the embodiment is trainable.

High performance and high functionality are desirable for computers and electronic devices. It is desirable for the arithmetic device to be able to accommodate an enormous amount of information processing. By increasing the scale of the information processing, for example, the enormous amount of information processing of the IoT (Internet of Things), AI (Artificial Intelligence), deep learning, etc., can be accommodated.

On the other hand, the development of energy-conserving electronics also is desirable. By higher energy conservation, for example, $CO_2$ reduction which is discussed on a global scale can be accommodated. By higher energy conservation, for example, the electrical power circumstances after a large-scale disaster can be relaxed.

For such circumstances, neural networks are drawing attention as energy-conserving electronics that learn from living bodies. The relationship between neural networks and electronics has an old history. For example, the neuron model of McCulloch and Pitts presented in 1943 is known (W. S. McCulloch and W. Pitts: Bull. Math. Biophys. 5, 115 (1943)).

Subsequently, Hopfield had a major breakthrough in the field of neural networks in 1982 (J. J. Hopfield: Proc. Natl. Acad. Sci. U.S.A. 79, 2554 (1982)). He showed that an interconnected network can be represented by the Hamiltonian of an Ising spin model. Thereby, it is possible to examine information processing in a neural network by using the statistical mechanics of a spin system. Further, it became possible to associate Ising spins, which can have the binary states of up or down spins, with the activity of a neuron or an information bit.

As a formal neural network, a device called the True North chip was developed jointly by IBM and Cornell University in 2014 (P. A. Merolla et al., Science 345, 668 (2014)). In this example, the device was constructed using 28-nm rule CMOS technology. As an entirety, the device operated as one million neurons. Compared to the brain of a human which is configured from 14 billion neurons, the scale of the device was small; and the power consumption was large.

A disadvantage of the concept of Hopfield's Ising machine and its hardware realized by the True North chip was that a learning function was not included. Neural network devices have been proposed to compensate for this disadvantage. For example, a restricted Boltzmann machine, a deep Boltzmann machine which is a more evolved restricted Boltzmann machine, etc., have been proposed. Further, the hardware of a neural network device generally called deep learning has been developed in recent years.

As described above, there are expectations for neural network devices having learning functions to be used as large-scale energy-conserving information processors comparable to the brain of a human. However, currently, larger scales and higher energy conservation both are exceedingly insufficient.

For example, the embodiment is applicable to a neural network device. For example, the embodiment can provide a larger scale and higher energy conservation in a neural network device. In the embodiment, for example, magnetic tracks are used in the memory part of a neural network device that has a learning function. Thereby, the neural network device (the arithmetic device) can have a larger scale. Energy conservation is possible.

One embodiment will now be described using a restricted Boltzmann machine as an example.

Figure 4:
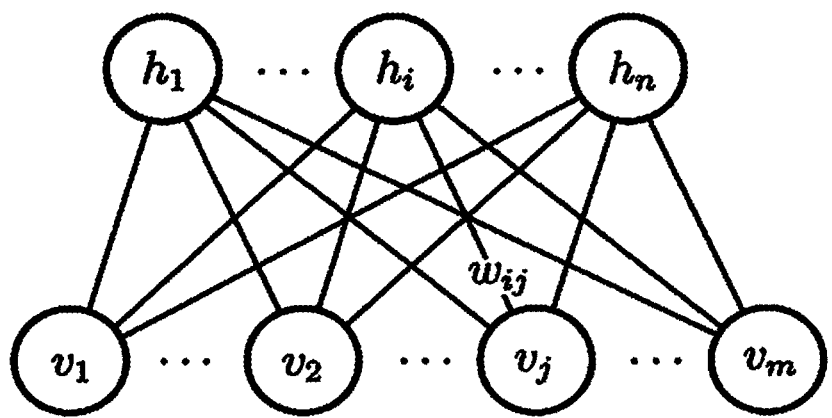
FIG. 4 is a schematic view illustrating a model applied to an arithmetic device.

FIG. 4 is a schematic view illustrating a model applied to an arithmetic device.

FIG. 4 illustrates the configuration of a restricted Boltzmann machine. The restricted Boltzmann machine includes a visible layer including m nodes $v_j$ (j=1, 2, ..., m), a hidden layer including n nodes $h_i$ (i=1, 2, ..., n), and links $w_{ij}$ connecting the visible layer and the hidden layer. The nodes and the links correspond respectively to neurons and synapses. External data is read into the neurons $v_j$ of the visible layer. Training of the synapses $w_{ij}$ is performed based on the external data read into the neurons $v_j$.

The training of the restricted Boltzmann machine proceeds by repeating the update of the synapses $w_{ij}$ by using the method shown by the arrows of Formula (1).

[Formula 1]

$$\begin{cases} w_{ij} \leftarrow w_{ij} + p(h_i = 1 \mid v^{(0)})v_j^{(0)} - p(h_i = 1 \mid v^{(k)})v_j^{(k)} \\ b_j \leftarrow b_j + v_j^{(0)} - v_j^{(k)} \\ c_i \leftarrow c_i + p(h_i = 1 \mid v^{(0)}) - p(h_i = 1 \mid v^{(k)}) \end{cases} \quad (1)$$

In Formula (1), "$v^{(0)}_j$" is the external data initially input to the visible layer of the machine. "$v^{(k)}_j$" is the data input to the visible layer after the arithmetic is repeated k times (k>=1).

The following Formula (2) is set.

[Formula 2]

$$\begin{cases} p(h_i = 1 \mid v^{(0)}) = \sigma\left(\sum_{j=1}^{m} w_{ij}v_j^{(0)} + c_i\right) \\ p(h_i = 1 \mid v^{(k)}) = \sigma\left(\sum_{j=1}^{m} w_{ij}v_j^{(k)} + c_i\right) \end{cases} \quad (2)$$

In Formula (2), "$p(h_i=1|v^{(0)})$" is the probability of "$h_i=1$" when "$v_j=v^{(0)}_j$." "$p(h_i=1|v^{(k)})$" is the probability of "$h_i=1$" when "$v_j=v^{(k)}_j$." In Formula (2), "$\sigma(\ )$" is a sigmoid function. "$c_i$" is the bias magnetic field of the hidden layer.

The training ends after the update is repeated for all of the external data.

In a conventionally-known restricted Boltzmann machine (a reference example), for example, an SRAM element is used as one neuron $v_j$ or $h_i$, one synapse $w_{ij}$, etc. Six transistors are included in each SRAM element.

Conversely, as described above, the line-shaped magnetic part 10L is used in the arithmetic device 110 (the restricted Boltzmann machine device) according to the embodiment. An example of the line-shaped magnetic part 10L will now be described.

Figure 5:
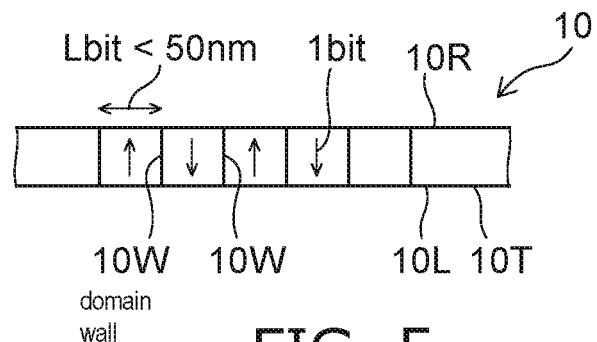
FIG. 5 is a schematic view illustrating a part of the arithmetic device according to the first embodiment.

FIG. 5 is a schematic view illustrating a part of the arithmetic device according to the first embodiment.

FIG. 5 illustrates the memory region 10R (the line-shaped magnetic part 10L) provided in the memory part 10. The line-shaped magnetic part 10L includes multiple domain walls 10W. For example, the domain walls 10W move through the line-shaped magnetic part 10L according to the current flowing through the line-shaped magnetic part 10L. The region (the magnetic domain) between two domain walls 10W corresponds to a region that stores memory. The orientations of the magnetizations in the line-shaped magnetic part 10L correspond to the stored information.

In the embodiment, one magnetic domain (1 bit) corresponds to a neuron. One magnetic domain (1 bit) corresponds to a synapse. A size Lbit (the length or the width) of one magnetic domain (1 bit) is 50 nm or less and is small. Thereby, compared to the reference example recited above (the structure including six transistors), the chip surface area can be reduced drastically.

For example, the line-shaped magnetic part 10L (e.g., the domain wall movement-type magnetic recording element) recited above is used as the m×n synapses which are plentiful compared to the (n+m) neurons. Thereby, the chip surface area can be reduced effectively.

In the embodiment, the read operation or the write operation is simple compared to the reference example recited above. Many elements (select transistors, address memory, controllers), etc., are necessary for the read operation and the write operation of the reference example recited above. In the embodiment, these circuits can be omitted. For example, it is particularly effective for the circuits to be omissible for small-scale memory of several 1000 bits. For example, small-scale memory is multiply used in an energy-conserving high-speed arithmetic device including many small-scale arithmetic units. It is particularly advantageous when the circuits can be omitted in a high-speed arithmetic device.

Generally, the update of the synapse coefficient is performed using the sigmoid function of Formula (2). In this method, for example, the probability calculation of the heat fluctuation at a temperature T is performed. Conversely, in the embodiment, the magnetic noise generation operation NO recited above can be performed. In the embodiment, for example, it is possible to use simulated annealing by using microwave irradiation from a spin torque oscillator.

Thereby, in the embodiment, it is possible to utilize a stochastic magnetization reversal phenomenon due to the application of a microwave magnetic field (magnetic field fluctuation). Thereby, the sigmoid function a of Formula (2) can be replaced with a step function $\sigma_0$. Further, "$p(h_i|v^{(0)})$" and "$p(h_i|v^{(k)})$" can be replaced respectively with "$h^{(0)}_i$" and "$h^{(k)}_i$."

Accordingly, in the embodiment, the following Formula (3) can be used instead of Formula (2).

[Formula 3]

$$\begin{cases} h_i^{(0)} = \sigma_0\left(\sum_{j=1}^m w_{ij}v_j^{(0)} + c_i\right) \\ h_i^{(k)} = \sigma_0\left(\sum_{j=1}^m w_{ij}v_j^{(k)} + c_i\right) \end{cases} \quad (3)$$

Accordingly, Formula (1) is replaced with Formula (4).

[Formula 4]

$$\begin{cases} w_{ij} \leftarrow w_{ij} + h_i^{(0)}v_j^{(0)} - h_i^{(k)}v_j^{(k)} \\ b_j \leftarrow b_j + v_j^{(0)} - v_j^{(k)} \\ c_i \leftarrow c_i + h_i^{(0)}v_j^{(0)} - h_i^{(k)}v_j^{(k)} \end{cases} \quad (4)$$

In the hardware of one example, the arithmetic proceeds using multiple arithmetic units PRU arranged in parallel from the perspective of the energy conservation and the higher speeds described above.

One example of the multiple arithmetic units PRU is shown in FIG. 1B.

Figure 16:
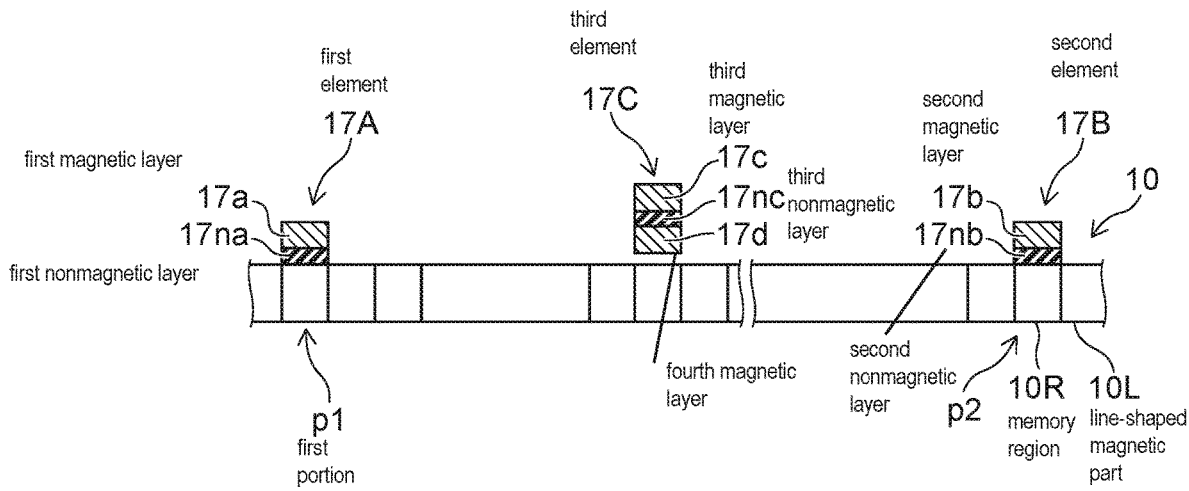
FIG. 16 is a schematic cross-sectional view illustrating a part of the arithmetic device according to the embodiment.

In FIG. 16, one arithmetic unit PRU corresponds to a sub-core. For example, the sub-core corresponds to the minimum unit of the arithmetic.

In the example, the sub-core SC(1, 1) includes three types of magnetic tracks 10T. The first magnetic track 10T corresponds to a magnetic track storing the states $v_j$ (1, −1) of the neurons of the visible layer. The second magnetic track 10T corresponds to a magnetic track 10T storing the states $h_j$ (1, −1) of the neurons of the hidden layer. The third magnetic track 10T corresponds to magnetic tracks storing the content of the synapses $w_{ij}$ to be trained. Four bits are allotted to the synapse $w_{ij}$.

An example of the operations performed by the embodiment will now be described. Here, n=m=1000 for simplification.

For example, first, the initial data $v^{(0)}_j$ (j=1, 2, ..., n) is written to the magnetic track 10T of $v_j$ by the first element (a spin injection element) described below. $h^{(0)}_1$ is calculated according to Formula (3); and the $h_1$ bit is updated. At this time, the reading of $v^{(0)}_j$ is performed by the second element (e.g., a tunneling magnetoresistance element) described below. The calculation of $h^{(0)}_1$ is performed by a product-sum operation device (the arithmetic part 20). The update of the $h_1$ bit is performed by spin injection programming.

A similar calculation is performed for the sub-cores SC(2, 1), ..., SC(1000, 1) as well. At least a part of these calculations is performed simultaneously. Thereby, $h^{(0)}_2$, ..., $h^{(0)}_{1000}$ are updated.

Here, $w_{2j}, \ldots, w_{1000j}$ tracks U=1, 2, ..., n) are included in each of the sub-cores SC(2, 1), ..., SC(1000, 1). The arithmetic is omissible for the magnetic tracks 10T corresponding to "$v_j$" and "$h_j$" that are common to the SC(1, 1). By using the obtained $h^{(0)}_j$, $v^{(1)}_j$ is calculated using Formula (5). Here, "$b_i$" is the bias magnetic field of the visible layer.

[Formula 5]

$$v_i^{(1)} = \sigma_0\left(\sum_{j=1}^m w_{ij}h_j^{(0)} + b_i\right) \quad (5)$$

$v^{(k)}_j$ is obtained by repeating a similar calculation k times (including one time).

Here, "$\sigma_0$" is a step function that is discontinuous at the origin. $w_{ij}$ is updated according to Formula (4) by using)"$h^{(0)}_i$" and "$h^{(k)}_i$" of Formula (3).

This operation is repeated for all of the data. Thereby, the training of the synapse $w_{ij}$, "$b_j$," and "$c_i$" ends. For example, the arithmetic unit (the arithmetic unit PRU) that includes 1000 sub-cores corresponds to the "core." The "core" includes $10^6$ synapses. By using multiple "cores," an even larger arithmetic device is obtained.

Figure 6:
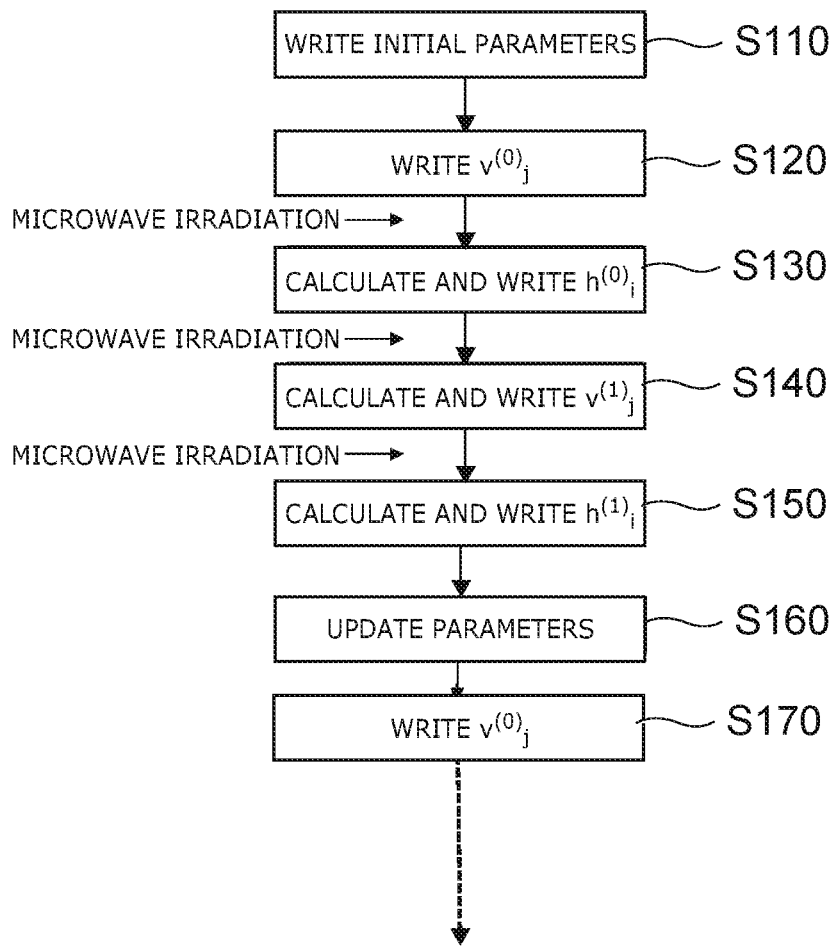
FIG. 6 is a flowchart illustrating the operations of the arithmetic device according to the first embodiment.

FIG. 6 is a flowchart illustrating the operations of the arithmetic device according to the first embodiment.

FIG. 6 shows an example of the arithmetic recited above. As shown in FIG. 6, the initial parameters are written (step S110). For example, the initial value of the parameter "$w_{ij}$" of the synapses, the initial value of the parameter "$b_j$" (the bias magnetic field) of the visible layer, and the initial value of the parameter "$c_i$" (the bias magnetic field) of the hidden layer are written to the line-shaped magnetic parts 10L (the magnetic tracks 10T).

"$v^{(0)}_j$" is written (step S120). First teaching data is written to the visible layer as $v^{(0)}_j$ (j=1, 2, . . . , m).

The calculation and the writing of "$h^{(0)}_i$" are performed (step S130). For example, $h^{(0)}_i$ (i=1, 2, . . . , n) is calculated from $v^{(0)}_j$ in a state of microwave (high frequency wave) irradiation and is written to the hidden layer.

The calculation and the writing of "$v^{(1)}_j$" are performed (step S140). For example, $v^{(1)}_j$ is calculated from $h^{(0)}_j$ in the state of microwave irradiation and is written to the hidden layer.

The calculation and the writing of "$h^{(1)}_i$" are performed (step S150). For example, $h^{(1)}_i$ (i=1, 2, . . . , n) is calculated from $v^{(1)}_j$ in the state of microwave irradiation and is written to the hidden layer.

The parameters are updated (step S160). For example, the values of "$w_{ij}$," "$b_j$," and "$c_i$" are updated using "$v^{(0)}_j$," "$v^{(1)}_j$," "$h^{(0)}_i$," and "$h^{(1)}_i$."

"$v^{(0)}_j$" is written (step S170). For example, second teaching data is written to the visible layer as $v^{(0)}_j$ (j=1, 2, . . . , m).

Then, the update of the parameters recited above (steps S120 to S170) is repeated using all of the teaching data.

Second Embodiment

FIG. 7A to FIG. 7C are schematic views illustrating a model of an arithmetic device according to a second embodiment.

FIG. 8 is a flowchart illustrating the operations of the arithmetic device according to the second embodiment.

The model shown in FIG. 7A to FIG. 7C is one model of deep learning. In the example, the second embodiment is described using a deep Boltzmann machine (DBM) as an example. Multiple hidden layers are stacked hierarchially in the DBM.

In the training of the DBM, first, the visible layer v and the hidden layer $h^{(1)}$ of the first layer are focused upon; and the hidden layers of the second and higher layers are ignored. Thereby, the visible layer v and the hidden layer $h^{(1)}$ of the first layer can be considered to be a restricted Boltzmann machine (RBM).

As shown in FIG. 8, "$w^{(1)}_{ij}$" is trained (step S210). For example, the connections "$w^{(1)}_{ij}$" between "v" and "$h^{(1)}$" are trained according to the training method of the RBM described above.

Then, "$w^{(2)}_{ij}$" is trained (step S220). For example, "$w^{(2)}_{ij}$" is trained by a method similar to a restricted Boltzmann machine by using the hidden layer "$h^{(1)}$" and the hidden layer "$h^{(2)}$." The initial value of "$h^{(1)}$" is obtained utilizing the data input to "v" and the trained "$w^{(1)}_{ij}$."

Then, "$w^{(3)}_{ij}$" is trained (step S230). For example, "$w^{(3)}_{ij}$" is trained by a method similar to a restricted Boltzmann machine by using the hidden layer "$h^{(2)}$" and the hidden layer "$h^{(3)}$." The initial value of "$h^{(2)}$" is obtained utilizing the data input to "v," the trained "$w^{(1)}_{ij}$," and the trained "$w^{(2)}_{ij}$."

Even in the case where the layers increase further, the connections can be trained by repeating a similar training method.

Figure 9:
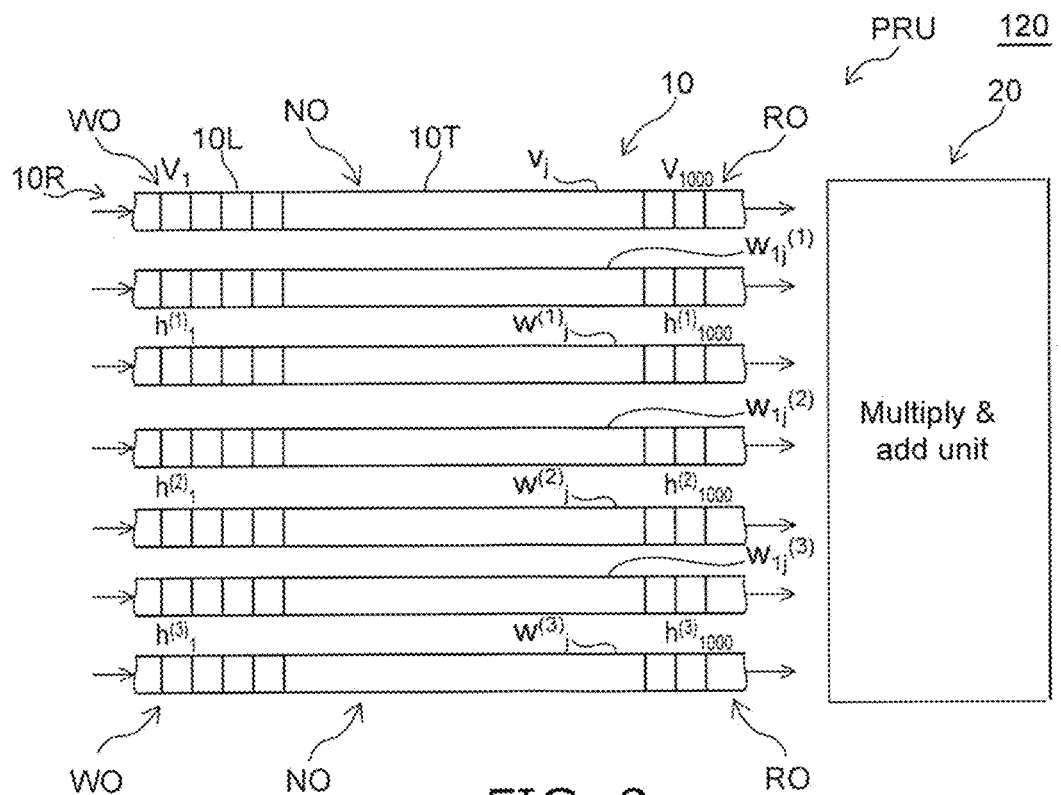
FIG. 9 is a schematic view illustrating the arithmetic device according to the second embodiment.

FIG. 9 is a schematic view illustrating the arithmetic device according to the second embodiment.

FIG. 9 shows an example of the sub-core (the arithmetic unit PRU) of the arithmetic device 120 according to the embodiment. As described above, the sub-core is the minimum unit of the arithmetic.

Third Embodiment

Figure 10:
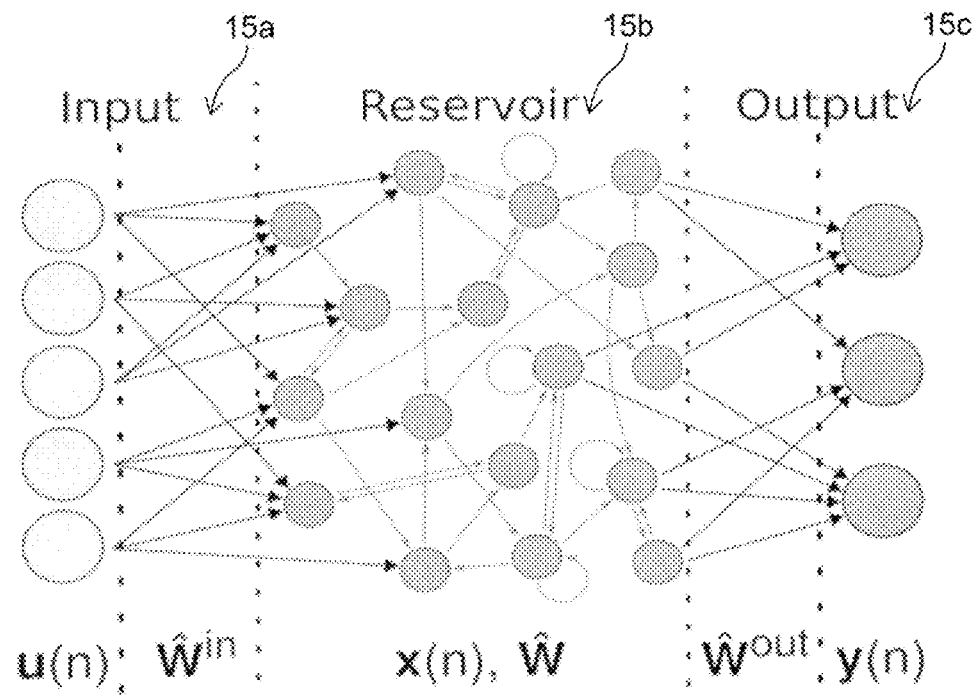
FIG. 10 is a schematic view illustrating a model of an arithmetic device according to a third embodiment.

FIG. 10 is a schematic view illustrating a model of an arithmetic device according to a third embodiment.

A model called an ESN (Echo State Network) is employed in the third embodiment as shown in FIG. 10. The arithmetic device according to the third embodiment is, for example, a reservoir computer (RC).

The ESN includes an inputter 15a, a reservoir part 15b, and an outputter 15c. For example, feedforward networks are formed in the inputter 15a and the outputter 15c. For example, a recurrent network (RNN) is formed in the reservoir part 15b. Generally, the training of the connection parameters of an RNN is exceedingly difficult. Therefore, only the connection parameters of the outputter 15c are trained in the RC. The number of nodes in the reservoir part 15b is overwhelmingly large compared to the number of nodes in the inputter 15a and in the outputter 15c. Continuous variables are used as the variables. Discrete time is used as the time. In the example, the number of nodes is set to 100 for the inputter 15a and for the outputter 15c; and the number of nodes is set to 1000 for the reservoir part 15b. The node variables and the connection parameters each are four bits.

FIG. 11 to FIG. 14 are schematic views illustrating the arithmetic device according to the third embodiment.

Figure 11:
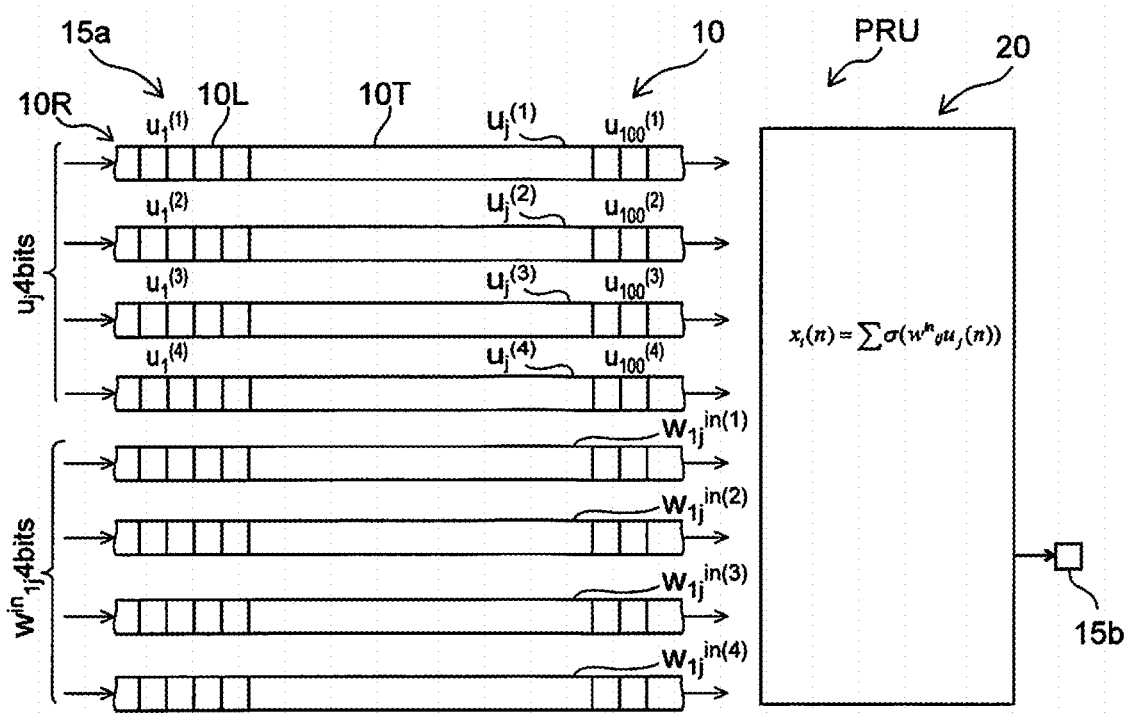
FIG. 11 is a schematic view illustrating the arithmetic device according to the third embodiment.
Figure 12:
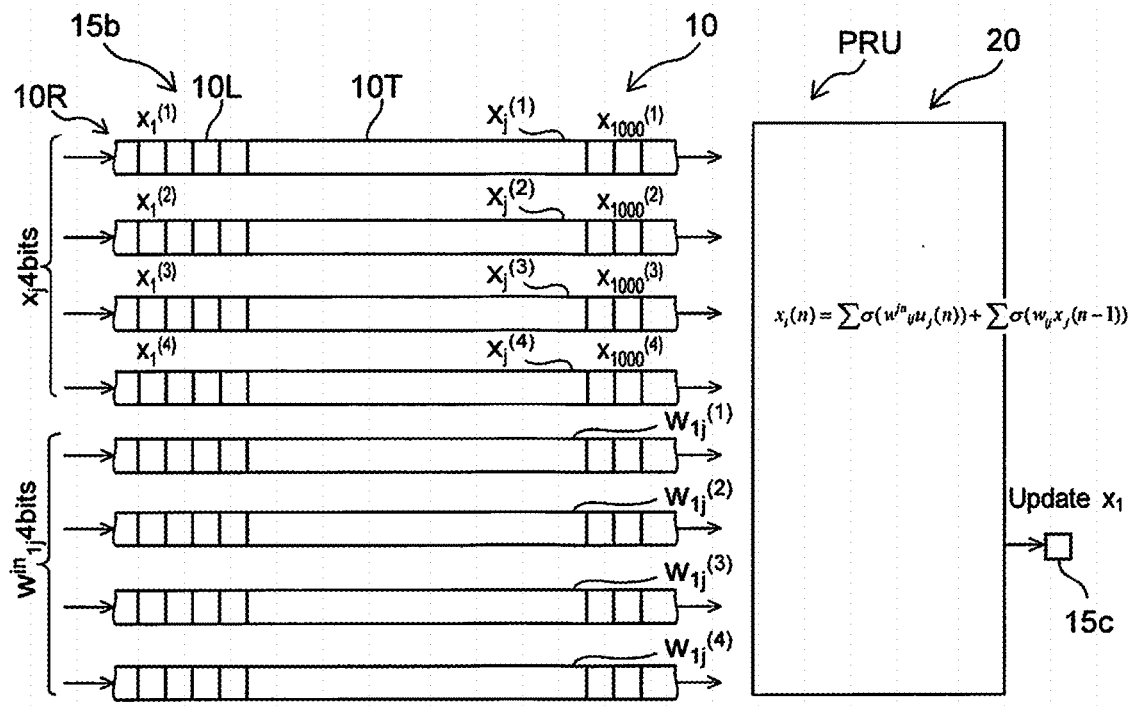
FIG. 12 is a schematic view illustrating the arithmetic device according to the third embodiment.
Figure 13:
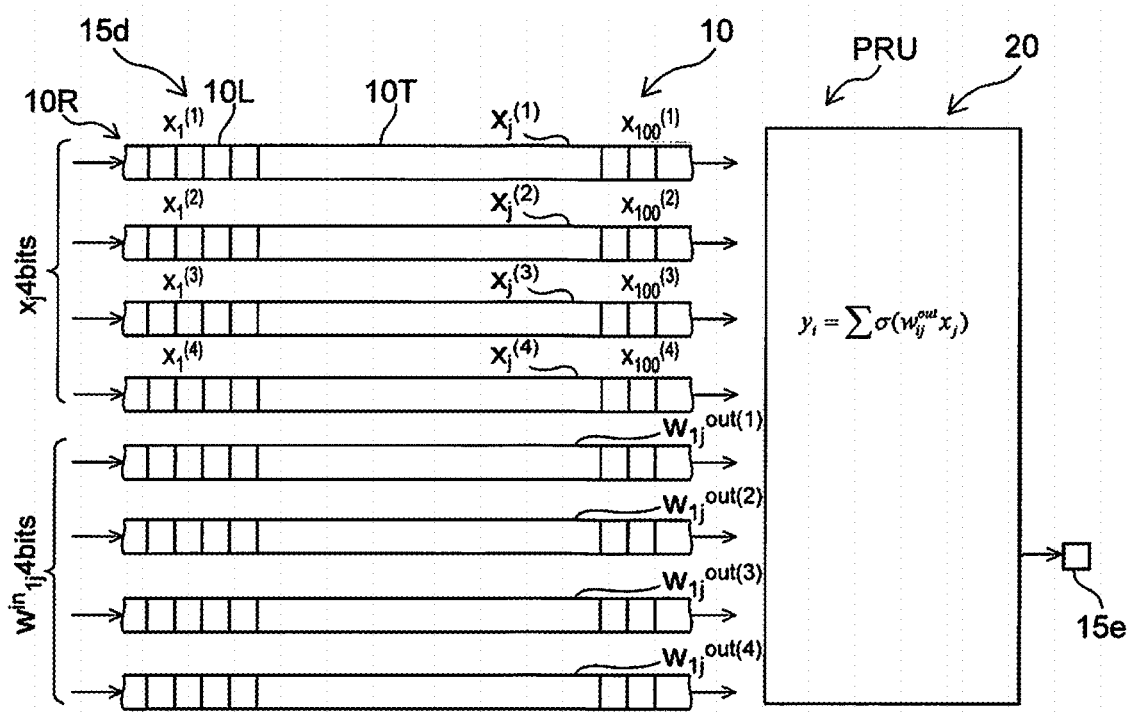
FIG. 13 is a schematic view illustrating the arithmetic device according to the third embodiment.
Figure 14:
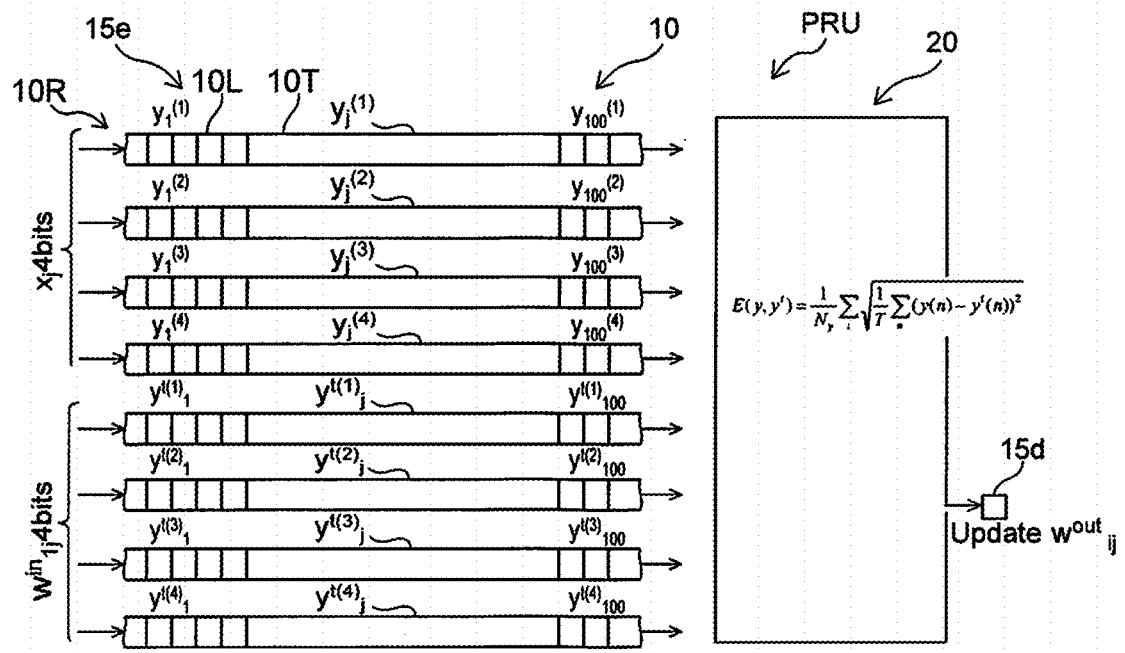
FIG. 14 is a schematic view illustrating the arithmetic device according to the third embodiment.

FIG. 11 illustrates the inputter 15a. FIG. 12 illustrates the reservoir part 15b. FIG. 13 illustrates a first outputter 15d. FIG. 14 illustrates a second outputter 15e.

In FIG. 11, a product-sum operation is performed in the arithmetic part 20. At this time, the training of "$w^{in}_{ij}$" is not performed. As shown in FIG. 11, the arithmetic result of the inputter 15a is provided to the reservoir part 15b.

In FIG. 12, a product-sum operation is performed in the arithmetic part 20. At this time, the training of "$w_{ij}$" is not performed. As shown in FIG. 12, the arithmetic result of the reservoir part 15b is provided to the outputter 15c.

As shown in FIG. 13, a product-sum operation is performed in the arithmetic part 20 of the first outputter 15d. The arithmetic result of the first outputter 15d is provided to the second outputter 15e.

As shown in FIG. 14, a product-sum operation is performed in the arithmetic part 20 of the second outputter 15e. The arithmetic result of the second outputter 15e is provided to the first outputter 15d. For example, the update of "$w^{out}_{ij}$" is performed.

The following Formula (6) and Formula (7) are used in the embodiment.

[Formula 6]

$$x(n)=\sigma(\Sigma w^{in}_{ij} u_j(n))+\sigma(\Sigma w_{ij} x_j(n-1)) \quad (6)$$

[Formula 7]

$$y(n)=\sigma(\Sigma w^{out}_{ij}, x_j(n)) \quad (7)$$

Figure 15:
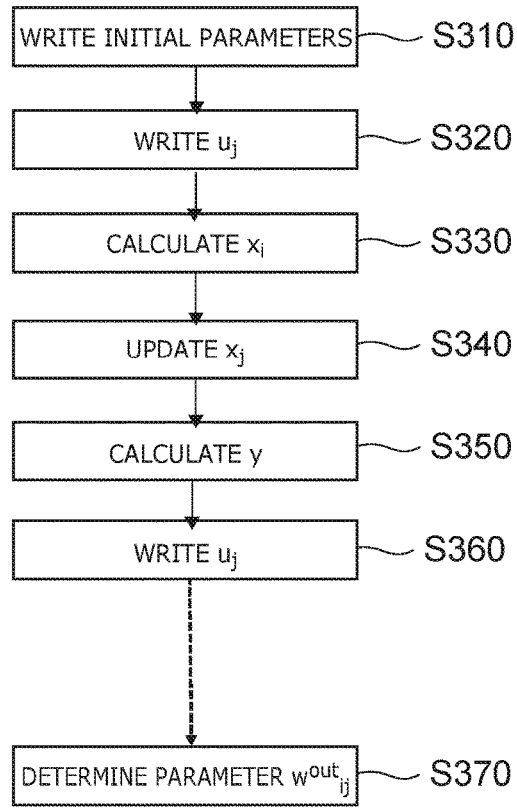
FIG. 15 is a flowchart illustrating the operations of the arithmetic device according to the third embodiment.

FIG. 15 is a flowchart illustrating the operations of the arithmetic device according to the third embodiment.

For example, the initial parameters are written (step S310). For example, the initial values of the parameters of the synapses and the initial value of the variable $x_j$ are written. The initial values of the parameters include the initial value of "$w^{in}_{ij}$," the initial value of "$w_{ij}$," and the initial value of "$w^{out}_{ij}$."

For example, "$u_j$" is written (step S320). For example, the teaching data of the first time step (n=1) is written to the input layer (the inputter 15a) as "$u_j$."

For example, "$x_i$" is calculated (step S330). For example, "$x_i$" is calculated from "$u_j$;" and the result is supplied to the reservoir part 15b. The variable x (1000 nodes) of the reservoir part 15b is updated using the initial value of the reservoir part 15b and the data u (100 nodes) written to the inputter 15a in the first time step (n=1) (referring to Formula (6)).

For example, "$x_j$" is updated (step S340). For example, "$x_j$" is updated from the initial value; and the result is supplied to the outputter 15c. For example, among the updated values, the states of 100 nodes are output to the outputter 15c (referring to Formula (7)). The connection parameters of the inputter 15a and the reservoir part 15b remain as the initial values without being updated.

For example, "y" is calculated (step S350).

For example, "$u_j$" is written (step S360). The teaching data of the second time step (n=2) is written to the input layer (the inputter 15a) as "$u_j$."

By repeating the description recited above, y(n) (n=1, 2, ... , T) is calculated using all of the teaching data. For example, the arithmetic recited above is repeated for n=1, 2, ... , T. Thereby, y(n) (n=1, 2, ... , T) is obtained.

The parameter "$w^{out}_{ij}$" woute is determined (step S370). The target value yt is written. For example, "$w^{out}_{ij}$" is determined to minimize the difference between "y(n)" and "yt" (referring to FIG. 14). For example, "$w^{out}_{ij}$" can be determined using the least-squares method, etc., because the outputter 15c is a simple feedforward network.

In the example recited above, at least two of the multiple arithmetic units PRU operate in parallel. Thereby, high-speed arithmetic is possible.

In the embodiments, for example, it is favorable for the memory capacity of the memory part 10 included in one of the multiple arithmetic units PRU to be $10^4$ bits or less. By setting the memory capacity of one memory part 10 to be relatively small and by performing the arithmetic in parallel, large-scale arithmetic (e.g., training) can be performed quickly.

Examples of the first to third elements described above will now be described.

FIG. 16 is a schematic cross-sectional view illustrating a part of the arithmetic device according to the embodiment.

As shown in FIG. 16, the memory part 10 may include a first element 17A. The first element 17A is, for example, a write element. The first element 17A includes a first magnetic layer 17a and a first nonmagnetic layer 17na. The first nonmagnetic layer 17na is provided between the first magnetic layer 17a and a first portion p1 of the line-shaped magnetic part 10L.

As shown in FIG. 16, the memory part 10 may include a second element 17B. The second element 17B is, for example, a read element. The second element 17B includes a second magnetic layer 17b and a second nonmagnetic layer 17nb. The second nonmagnetic layer 17nb is provided between the second magnetic layer 17b and a second portion p2 of the line-shaped magnetic part 10L.

As shown in FIG. 16, the memory part 10 may include a third element 17C. The third element 17C includes a third magnetic layer 17c, a fourth magnetic layer 17d, and a third nonmagnetic layer 17nc. The third nonmagnetic layer 17nc is provided between the third magnetic layer 17c and the fourth magnetic layer 17d.

For example, the write operation WO is performed by the first element 17A based on spin injection. For example, the read operation RO is performed by the second element 17B based on the magnetoresistance effect (e.g., the tunneling magnetoresistance effect). The magnetic noise generation operation NO is performed by the third element 17C based on a high frequency magnetic field due to spin torque oscillation.

According to the embodiments, an arithmetic device can be provided in which a larger scale is possible.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in arithmetic devices such as arithmetic units, memory parts, memory regions, line-shaped magnetic parts, and elements, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all arithmetic devices practicable by an appropriate design modification by one skilled in the art based on the arithmetic devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An arithmetic device, comprising one or a plurality of arithmetic units, one of the one or the plurality of the arithmetic units including a memory part including a plurality of memory regions, and an arithmetic part, at least one of the plurality of memory regions including a line-shaped magnetic part, wherein the memory part includes a first element, and the first element includes:

a first magnetic layer, and a first nonmagnetic layer provided between the first magnetic layer and a first portion of the line-shaped magnetic part, and a length of the first element in an extending direction of the line-shaped magnetic part is less than a length of the line-shaped magnetic part in the extending direction.

2. The device according to claim 1, wherein the arithmetic device is trainable.

3. The device according to claim 1, wherein the line-shaped magnetic part includes a magnetic track.

4. The device according to claim 1, wherein the line-shaped magnetic part includes a domain wall, and the domain wall moves through the line-shaped magnetic part according to a current flowing through the line-shaped magnetic part.

5. The device according to claim 1, wherein at least two of the plurality of arithmetic units operate in parallel.

6. The device according to claim 1, wherein a memory capacity of the memory part included in the one of the plurality of arithmetic units is 104 bits or less.

7. The device according to claim 1, wherein the memory part includes a second element, and the second element includes:

a second magnetic layer; and a second nonmagnetic layer provided between the second magnetic layer and a second portion of the line-shaped magnetic part.

8. The device according to claim 1, wherein the memory part includes a third element, and the third element includes:

a third magnetic layer;

a fourth magnetic layer; and a third nonmagnetic layer provided between the third magnetic layer and the fourth magnetic layer.

\* \* \* \* \*